United States Patent [19]

Gontowski

[11] Patent Number: 4,999,527

[45] Date of Patent: Mar. 12, 1991

[54] ONE-SPOT MULTIVIBRATOR

[75] Inventor: Walter S. Gontowski, Thompson, Conn.

[73] Assignee: Cherry Semiconductor Corporation, East Greenwich, R.I.

[21] Appl. No.: 356,886

[22] Filed: May 25, 1989

[51] Int. Cl.$^5$ ...................... H03K 3/284; H03K 3/017

[52] U.S. Cl. .................................... 307/273; 307/265; 307/299.2; 307/272.1

[58] Field of Search ..................... 307/265, 273, 299.2, 307/272.1, 268, 355, 358

[56] References Cited

U.S. PATENT DOCUMENTS 4,009,404 2/1977 Kuo .................................... 307/273

4,667,118 5/1987 Maruta .............................. 307/273

4,668,881 5/1987 Piasecki ............................ 307/273

FOREIGN PATENT DOCUMENTS 0081920 5/1985 Japan ................................. 307/273

*Primary Examiner*—Timothy P. Callahan

*Attorney, Agent, or Firm*—Robert M. Asher; Henry D. Pahl, Jr.

[57] ABSTRACT

The one-shot multivibrator disclosed herein provides precise timing at high speed by controlling the charging and discharging of a timing capacitor over a voltage swing which is compensated so as to be essentially independent of any temperature-dependent offset voltages such as base-emitter drops.

3 Claims, 2 Drawing Sheets

ONE-SPOT MULTIVIBRATOR

BACKGROUND OF THE INVENTION

The present invention relates to a one-shot multivibrator circuit and more particularly to such a circuit which provides precise timing at high speeds, e.g. 100 nanoseconds output pulse width.

In various types of control circuits, e.g. special purpose integrated circuits which are used to control the operation of resonant-mode power supplies, it is desirable to incorporate a one-shot multivibrator which provides precise and adjustable timing at relatively high speeds. For example, in such resonant-mode power supplies, an output switch is turned on periodically, e.g. in response to a voltage controlled oscillator, to apply power to an inductive/capacitive load which forms a resonant tank circuit. The output switch, whether it be a bipolar transistor or a field-effect transistor, should be turned on for a precisely fixed time. The "on" time is typically controlled by a one-shot multivibrator.

To realize the maximum benefits from a resonant-mode power supply, the operating frequency should be as high as possible with the given integrated circuit technology. This allows the use of small and light-weight resonating components, keeping the size and cost of the power supply at a minimum. Typically, such special-purpose integrated circuits are constructed using bipolar fabrication techniques providing a mixture of analog and digital functionality.

Among the objects of the present invention may be noted the provision of a one-shot multivibrator circuit which is operable at high speed; the provision of such a multivibrator circuit which provides precise timing; the provision of such a multivibrator circuit in which the timed interval is relatively insensitive to temperature variation; the provision of such a multivibrator circuit which may be fabricated using bipolar integrated circuit technology; the provision of such a monostable multivibrator circuit which is highly reliable and which is of relatively simple and inexpensive construction. Other objects and features will be in part apparent and in part pointed out hereinafter.

SUMMARY OF THE INVENTION

In the one-shot multivibrator circuit of the present invention, a timing capacitor is initially charged, through an emitter-follower, to a level which is equal to a supply voltage less a base-emitter drop. The operation of the emitter-follower is initiated by a trigger pulse which also sets a latch circuit. A timed output signal is provided after the trigger pulse interval and while the latch is set. A pair of transistors are interconnected as a differential emitter-follower comparator to sense the capacitor voltage at one comparator input. The other comparator input is provided with a voltage which is a base-emitter drop below a reference voltage which is, in turn, a preselected proportion of the supply voltage. After the trigger interval, the capacitor discharges and when the capacitor voltage falls below the other comparator input, the comparator resets the latch. The output timing is thus a stable function of the difference between the supply voltage and the reference voltage, temperature-dependent base-emitter drops being effectively cancelled.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
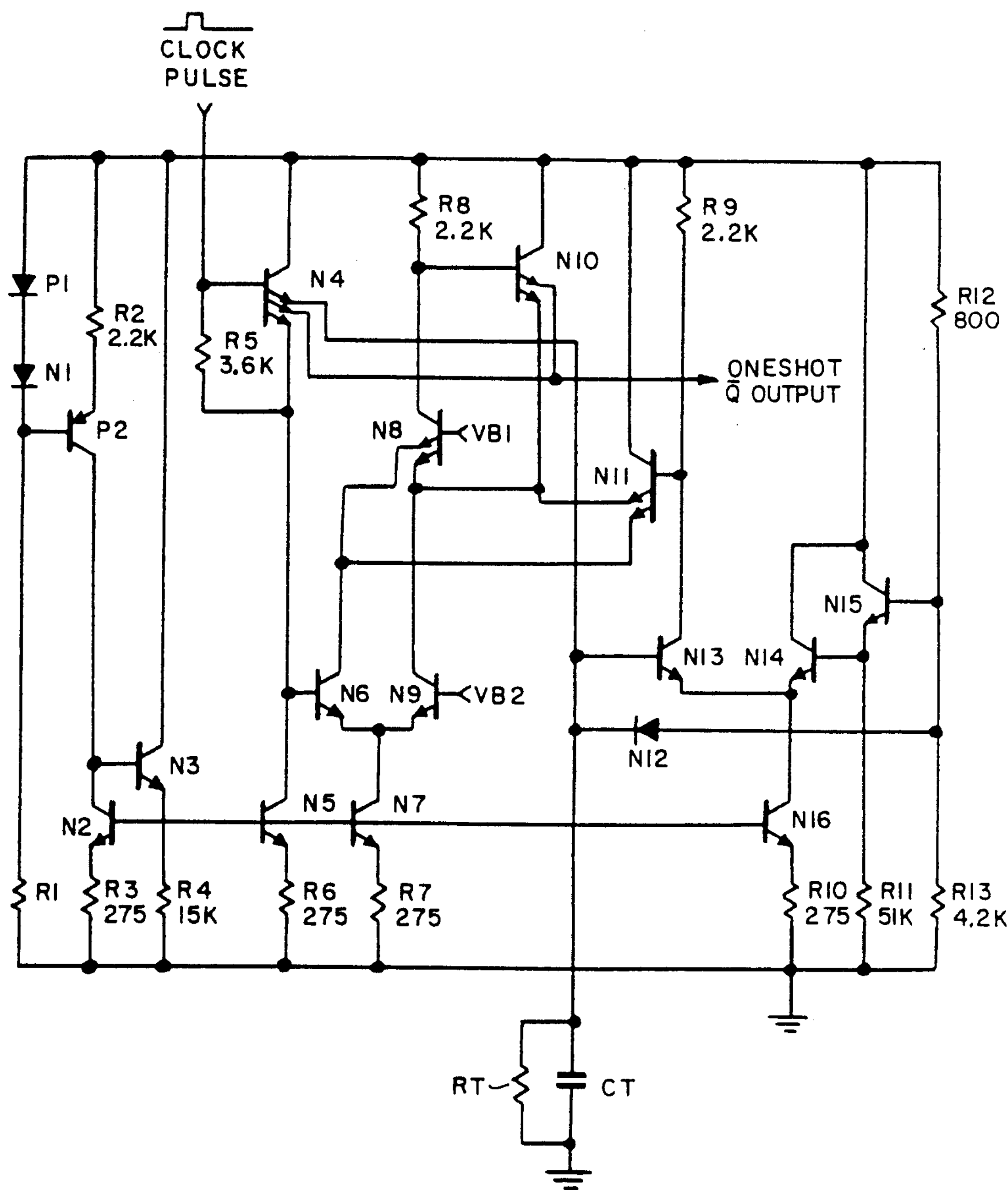
FIG. 1 is a shematic circuit diagram of a one-shot multivibrator constructed in accordance with the present invention.

Referring now to FIG. 1, the circuitry illustrated there to a large extent employs non-saturated emitter-follower logic. In particular, a pair of NPN transistors N6 and N9 are interconnected in an emitter-follower latch circuit and a pair of NPN transistors N13 and N14 are interconnected as an emitter-follower comparator. The emitters of transistors N6 and N7 are connected together and a constant current is shared between them, this current being obtained from the collector of an NPN transistor N7. Similarly, the emitters of transistors N13 and N14 are connected together and a constant current is shared between them, this constant current being obtained from the collector of an NPN transistor N16. A constant current supply is also provided at the collector of an NPN transistor N5, this current being applied to one of the emitters of an input transistor N4.

Each of the current biasing output transistors N5, N7 and N16 is provided with a respective current-determining resistor in its emitter lead, these being resistors R6, R7 and R10, respectively. An appropriate bias voltage is applied to the bases of transistors N5, N7 and N16 by current mirror circuitry including transistors N2 and N3 which are in turn biased by the collector current from a PNP transistor P2. The bias voltage at the base of transistor P2 is established by the forward voltage drops across a pair of diodes P1 and N1 with the current through the transistor being determined with the value of a resistor R2.

The collectors of the latch transistors N6 and N7 are connected to the emitters of a transistor N11. The voltage at the base of N11 is in turn controlled by the voltage at the collector of transistor N13, this voltage being determined by conduction through transistor N13 and the resultant voltage drop across a resistor R9. Between output pulses from the multivibrator, N13 is off and thus the base of transistor N11 is forward biased so that the emitters of transistor N11 will conduct the collector currents of the latch transistors N6 and N9.

The collectors of transistors N6 and N9 are also connected to the emitters of a transistor N8, an appropriate bias voltage being applied to the base of transistor N8 to keep the transistor N8 normally off between output pulses of the multivibrator circuit. A lower bias voltage is applied to the base of one of the emitter-follower latch transistors N9. With transistor N8 non-conducting, transistor N10 is forward biased by current flowing through resistor R8. The top emitter of transistor N10 is connected to the output terminal and thus holds that terminal high between output pulses.

The upper emitter of the transistor N4 is connected as an emitter-follower for selectively charging an external timing capacitor designated CT. Capacitor CT is shunted by an external timing resistor RT which discharges the capacitor in the absence of charging.

A voltage divider comprising a pair of resistors R12 and R13 provides, at the base of an NPN transistor N15, a reference or threshold voltage which is a preselected proportion of the supply voltage. Transistor N15 functions as an emitter-follower to apply, to the base of transistor N14, a voltage which is one base-emitter drop below the reference voltage.

To initiate operation of the one-shot multivibrator, a positive-going trigger pulse is applied to the base of transistor N4. The top emitter of transistor N4 quickly charges the timing capacitor CT up to a voltage equal to the supply voltage minus the base-emitter voltage drop of N4. At the same time, the bottom emitter of N4 turns latch transistor N6 on and this action, in turn, turns transistor N9 off. In accordance with one aspect of the present invention, however, the output pulse and the timing interval do not begin until the end of the trigger pulse. During the trigger pulse, the top emitter of transistor N4 acts as an emitter-follower to charge the external capacitor C1 to a voltage which is essentially one base-emitter drop below the supply voltage. The second emitter of transistor N4 provides the output signal from the one-shot multivibrator and this emitter is also connected to one of the emitters of the transistor N10.

As the capacitor CT charges and forward biases transistor N13, the current drawn by transistor N13 through resistor R9 cuts off transistor N11. The collector currents from transistors N6 and N7 which were previously passing through transistor N11 will therefore flow through transistor N8 and the resultant collector current through resistor R8 will turn off transistor N10. Although transistor N10 is thus turned off by the start of the clock pulse, the output signal, however, will be held high by the second emitter of transistor N4 until the end of the trigger interval.

At the end of the trigger interval, the trigger pulse drops back to ground and the output line goes low. The time that this output is low is the timed one-shot pulse period. Since charging of the timing capacitor also terminates at the end of the triggering interval, the external capacitor C1 will then discharge under the influence of the shunt resistor RT. During discharge, the capacitive voltage is essentially monitored by the base of transistor N13. When it reaches a level which is lower than the other comparator input, i.e. the base of transistor N14, the transistor N13 will stop conducting. The drop in collector current through transistor N13 will cause the voltage at the base of transistor N11 to quickly rise to a voltage higher than that at the base of transistor N8 and N8 will be turned off and N10 will, in turn, be turned on. The bottom emitter of transistor N10 is connected to the bottom-emitter of transistor N8 to ensure that N8 remains off. This action essentially resets the latch and the output signal, generated by the upper emitter of transistor N10 will again go high. This is the end of the one-shot pulse.

Since both the top level to which the capacitor is charged and the bottom level to which it is discharged are derived from the power supply voltage minus respective base-emitter drops, it can be seen that the voltage range over which the timing capacitor is charged and discharged is essentially independent of temperature-dependent base-emitter drops. Thus the timing will be quite accurate and stable and determined essentially only by the values of the external timing components.

Figure 2:
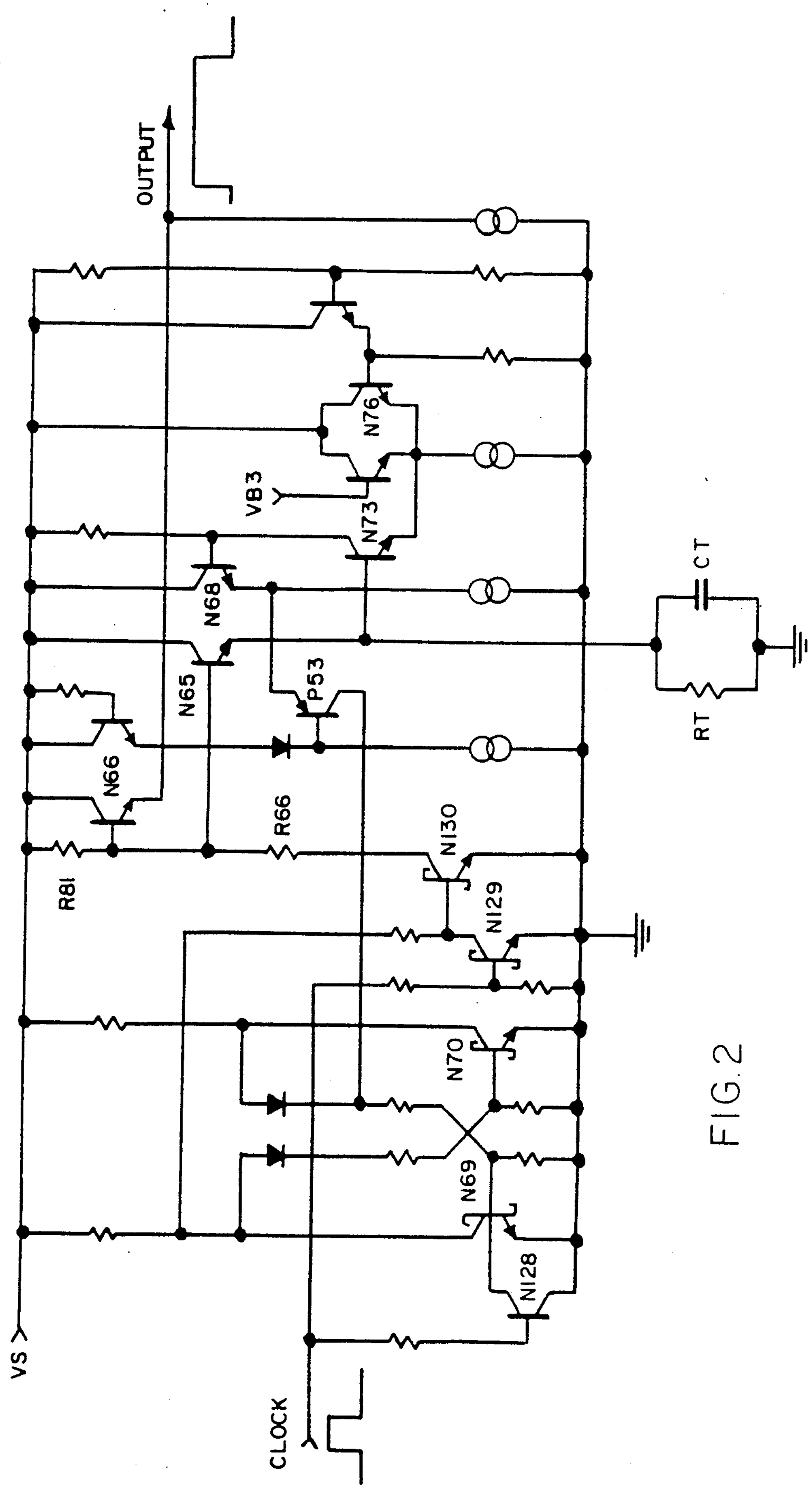
FIG. 2 is a schematic circuit diagram of an alternate embodiment of the multivibrator circuit.

The embodiment of FIG. 2 is essentially similar to that of FIG. 1 except that the emitter-follower latch of FIG. 1 has been replaced by a more conventional RS latch employing a pair of Schottky transistors N69 and N70 and a somewhat different charging circuit has been provided for the timing capacitor. In this embodiment, the trigger pulse is applied, to the bases of a pair of transistors N128 and N129. The transistor N128 causes the RS latch to be set by the triggering pulse. The triggering pulse also turns on transistor N129 which, through its collector, turns off the transistor N130. When transistor N130 is turned off, the resistors R81 and R66 in the collector circuit of transistor N130 turn on a pair of NPN transistors N65 and N66. These transistors, in effect, replace the dual emitter transistor N10 of the FIG. 1 embodiment. The transistor N65 functions as an emitter-follower charging the external timing capacitor CT while the transistor N66 generates the output signal. As the voltage at the base of transistor N65 rises more slowly than that at the base of transistor N66, i.e. due to the loading provided by the timing capacitor, the switching over of the RS latch is facilitated.

Once the capacitor is charged, and the triggering pulse has ended, the timing capacitor CT discharges under the influence of the shunt resistor RT until the voltage at the base of transistor N73 drops below that at the base of transistor N76. As transistor N73 is cut off, the voltage at its collector and at the base of transistor N68 rises quickly. The emitter of transistor N68 is connected to the emitter of a PNP transistor P53 which is connected in a common base mode. Thus, as transistors N68 and N53 start to conduct, the RS latch is again reset by the collector current from transistor P53.

Again, the range of voltage over which the timing capacitor CT is charged and discharged is defined essentially by the difference between the supply voltage and the reference voltage generated by the resistive voltage divider. Accordingly, the actual range of voltage traversed by the timing capacitor is essentially independent of base-emitter drops since the base-emitter drops are offset and thus do not substantially affect the timing accuracy. Rather, timing is determined essentially solely by the external timing components.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A precision, high speed one-shot multivibrator operable from a stable supply voltage and responsive to an initiating trigger pulse, said multivibrator comprising:

timing components including a capacitor one side of which can be charged and discharged and the other side which is maintained at a fixed potential and means for discharging said capacitor;

emitter-follower means powered from said supply voltage and responsive to said trigger pulse for selectively charging said one side of said capacitor to said supply voltage less a base-emitter drop;

a latch circuit which is set by said trigger pulse and which provides an output satate indication;

a balanced comparator providing a pair of inputs, one of which is responsive to the voltage on said one side of said capacitor;

means for providing a reference voltage which is preselected proportion of said supply voltage;

an emitter-follower separate from said comparator for providing, as the other input to said comparator, a voltage which is a base-emitter drop below said reference voltage, said comparator being connected to said latch for resetting said latch when the capacitor voltage drops below the said other input, whereby timing of the one-shot output is a stable function of the difference between said supply voltage and said reference voltage.

2. A precision, high speed one-shot multivibrator operaable from a stable supply voltage and responsive to an initiating trigger pulse, said multivibrator comprising:

timing components including a capacitor one side of which can be charged and discharged and the other side which is maintained at a fixed potential and means for discharging said capacitor;

emitter-follower means powered from said supply voltage and responsive to said trigger pulse for selectively charging said one side of said capacitor to said supply voltage less a base-emitter drop;

a latch circuit which is set by said trigger pulse and which provides an output state indication;

a pair of transistor interconnected as a balanced differential emitter-follower comparator, an essentially constant current being applied to and shared by the emitters of said pair;

means for providing a reference voltage which is preselected proportion of said supply voltage;

an emitter-follower separate from said comparator for providing, as one input to said comparator, a voltage which is a base-emitter drop below said reference voltage;

means for applying the voltage on said capacitor as the other input to said comparator, said comparator being connected to said latch for resetting said latch when the capacitor voltage drops below the said one input, whereby tinming of the one-shot output is a stable function of the difference between said supply voltage and said reference voltage.

3. A precision, high speed one-shot multivibrator operable from a stable supply voltage and responsive to an initiating trigger pulse, said multivibrator comprising:

timing components including a capacitor one side of which can be charged and discharged and the other side which is maintained at a fixed potential and means for discharging said capacitor;

emitter-follower means powered from said supply voltage and responsive to said trigger pulse for selectively charging said one side of said capacitor to said supply voltage less a base-emitter drop;

a latch circuit which is set by said trigger pulse and which provides an output state indication;

current bias circuitry including at least two transistors whose bases are connected together and whose emitters are provided with respective current value determining resistors, said bias circuitry inclduing also means for applying a preselected current to the collector of a first one of said two transistors thereby to estblish a corresponding current a the collector of a second one of said transistors;

a differential, emitter-follower balanced comparator circuit including at least two transistors, the emitters of which are connected in common to the collector of said second one of said current bias transistors, the base terminals of said comparator transistors being the comparator inputs;

means for providing a reference voltage which is a preselected proportion of said supply voltage;

an emitter-follower separate from said comparator for providing, as one input to said comparator, a voltage which is a base-emitter drop below said reference voltage;

means for applying the voltage on said capacitor as the other input to said comparator, said comparator being connected to said latch for resetting said latch when the capacitor voltage drops below the said one input, whereby timing of the one-shot output is a stable function of the difference between said supply voltage and said reference voltage.

* * * * *